United States Patent
Plößl

(10) Patent No.: US 12,020,973 B2
(45) Date of Patent: Jun. 25, 2024

(54) TRANSFER TOOL AND METHOD FOR TRANSFERRING SEMICONDUCTOR CHIPS

(71) Applicant: OSRAM Opto Semiconductors GmbH, Regensburg (DE)

(72) Inventor: Andreas Plößl, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 641 days.

(21) Appl. No.: 17/287,080

(22) PCT Filed: Oct. 24, 2019

(86) PCT No.: PCT/EP2019/079071
§ 371 (c)(1),
(2) Date: Apr. 20, 2021

(87) PCT Pub. No.: WO2020/089036
PCT Pub. Date: May 7, 2020

(65) Prior Publication Data
US 2021/0384062 A1    Dec. 9, 2021

(30) Foreign Application Priority Data

Oct. 30, 2018    (DE) .......................... 102018127123.9

(51) Int. Cl.
*B25B 11/00* (2006.01)
*B29C 65/78* (2006.01)
(Continued)

(52) U.S. Cl.
CPC .......... *H01L 21/6838* (2013.01); *B25B 11/00* (2013.01); *B29C 65/7841* (2013.01);
(Continued)

(58) Field of Classification Search
CPC ..... B25B 11/00; B25B 11/002; B25B 11/005; B25B 11/007; B29C 65/7841;
(Continued)

(56) References Cited

U.S. PATENT DOCUMENTS 8,037,918 B2    10/2011  Wang et al.
11,328,942 B1 *  5/2022  Wallin .............. H01L 21/67115
(Continued)

FOREIGN PATENT DOCUMENTS

CN    1894787 A    1/2007
CN    101527286 A    9/2009
(Continued)

OTHER PUBLICATIONS

Matthew A. Meitl, et al., "Transfer Printing by Kinetic Control of Adhesion to an Elastomeric Stamp," Letters, Nature Materials, vol. 5, Jan. 2006, www.nature.com/naturematerials, 6 pages.
(Continued)

*Primary Examiner* — Michael A Tolin
(74) *Attorney, Agent, or Firm* — Slater Matsil, LLP

(57) ABSTRACT

In an embodiment a transfer tool includes an adhesive stamp having an adhesive surface configured to pick up a semiconductor chip and a device configured to adjust a surface area of the adhesive surface, wherein the adhesive stamp is deformable, wherein the adhesive surface is formed by a part of an outer surface of the adhesive stamp, wherein the surface area of the adhesive surface is adjustable by deformation of the adhesive stamp, and wherein the adhesive surface is free of interruptions.

19 Claims, 6 Drawing Sheets

(51) Int. Cl.
    *H01L 21/67*     (2006.01)
    *H01L 21/683*     (2006.01)
    *H05K 13/04*     (2006.01)

(52) U.S. Cl.
    CPC ........ *B29C 65/785* (2013.01); *B29C 65/7852* (2013.01); *H01L 21/67* (2013.01); *H01L 21/67132* (2013.01); *H05K 13/0408* (2013.01); *H05K 13/041* (2018.08); *H05K 13/0478* (2013.01); *H01L 2224/7565* (2013.01)

(58) Field of Classification Search
    CPC .............. B29C 65/7847; B29C 65/785; B29C 65/7852; B65G 47/90; H01L 21/67; H01L 21/67132; H01L 21/67144; H01L 21/67271; H01L 21/67288; H01L 21/67721; H01L 21/68; H01L 21/683; H01L 21/6835; H01L 21/6836; H01L 21/6838; H01L 2221/683; H01L 2221/68304; H01L 2221/68368; H01L 2224/75252; H01L 2224/753; H01L 2224/75301; H01L 2224/75302; H01L 2224/75303; H01L 2224/75304; H01L 2224/7565; H05K 13/0404; H05K 13/0408; H05K 13/0409; H05K 13/041; H05K 13/0411; H05K 13/046; H05K 13/0478
See application file for complete search history.

(56) References Cited

U.S. PATENT DOCUMENTS

| | | |
|---|---|---|
| 2006/0285965 A1 | 12/2006 | Kabeshita et al. |
| 2007/0138605 A1 | 6/2007 | Nam et al. |
| 2009/0218685 A1 | 9/2009 | Narita et al. |
| 2010/0123268 A1 | 5/2010 | Menard |
| 2014/0027049 A1 | 1/2014 | Joo et al. |
| 2015/0279716 A1 | 10/2015 | Ko |
| 2017/0133257 A1 | 5/2017 | Wu et al. |
| 2017/0345692 A1 | 11/2017 | Liu et al. |
| 2019/0244846 A1 | 8/2019 | Hsieh et al. |
| 2019/0252350 A1 | 8/2019 | Schwarz et al. |
| 2021/0136966 A1 | 5/2021 | Jang et al. |

FOREIGN PATENT DOCUMENTS

| | | | |
|---|---|---|---|
| CN | 108389825 A | 8/2018 | |
| DE | 102016221281 A1 | 5/2018 | |
| JP | 2007180104 A | 7/2007 | |
| JP | 2008141068 A | 6/2008 | |
| JP | 2011086698 A | 4/2011 | |
| KR | 1020040098311 A | 11/2004 | |
| KR | 100603709 B1 | 7/2006 | |
| KR | 100666919 B1 | 1/2007 | |
| KR | 100876965 B1 | 1/2009 | |
| KR | 20170138794 A | 12/2017 | |
| KR | 20180117004 A | 10/2018 | |
| KR | 20190018385 A | 2/2019 | |
| WO | 2018033248 A2 | 2/2018 | |
| WO | WO-2018070988 A1 * | 4/2018 | .......... B41J 2/14016 |

OTHER PUBLICATIONS

Timothy J. White, et al., "Programmable and Adaptive Mechanics with Liquid Crystal Polymer Networks and Elastomers," Nature Materials, Review Article, Oct. 22, 2015, 12 pages.

* cited by examiner

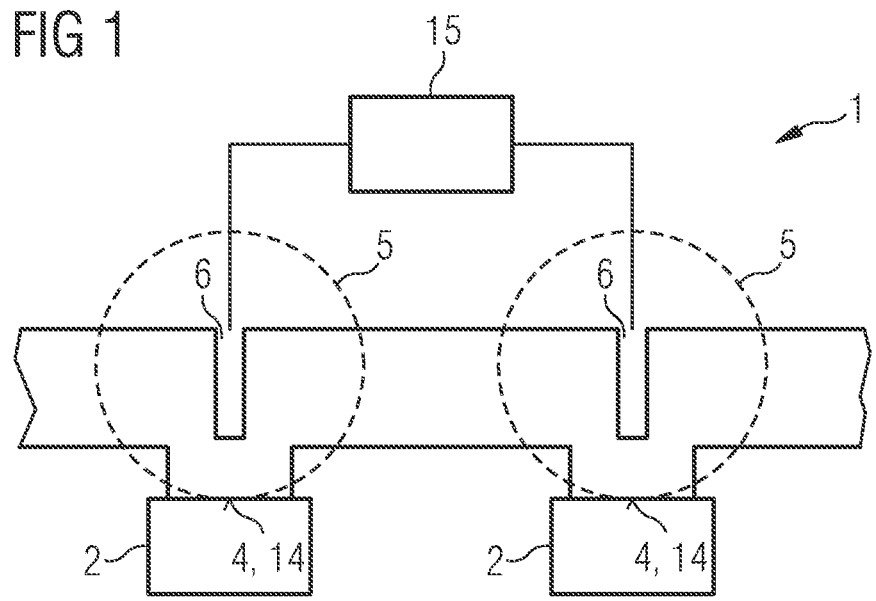
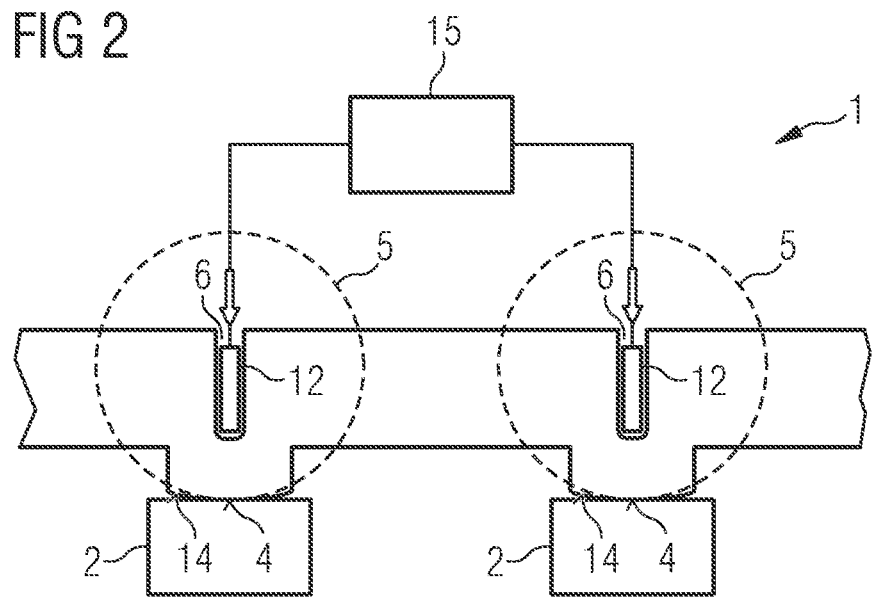

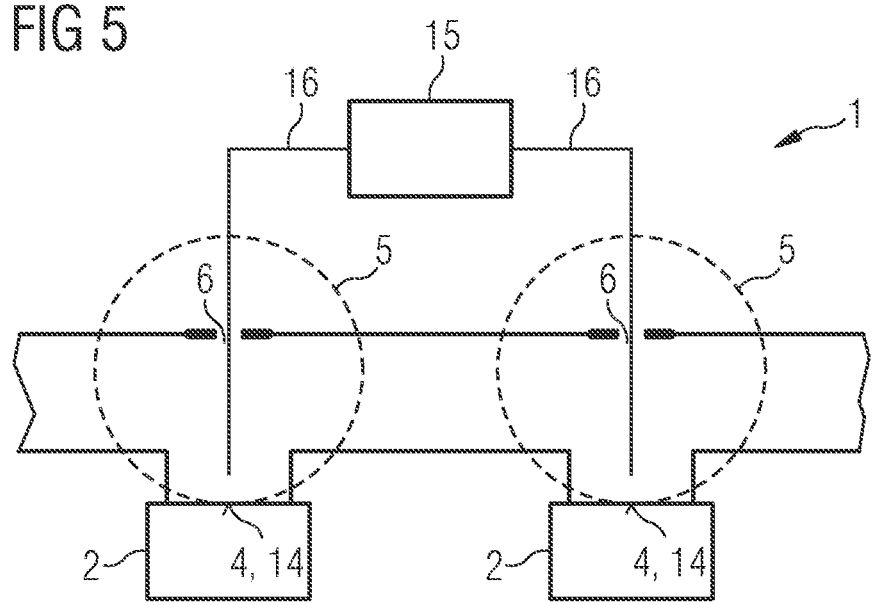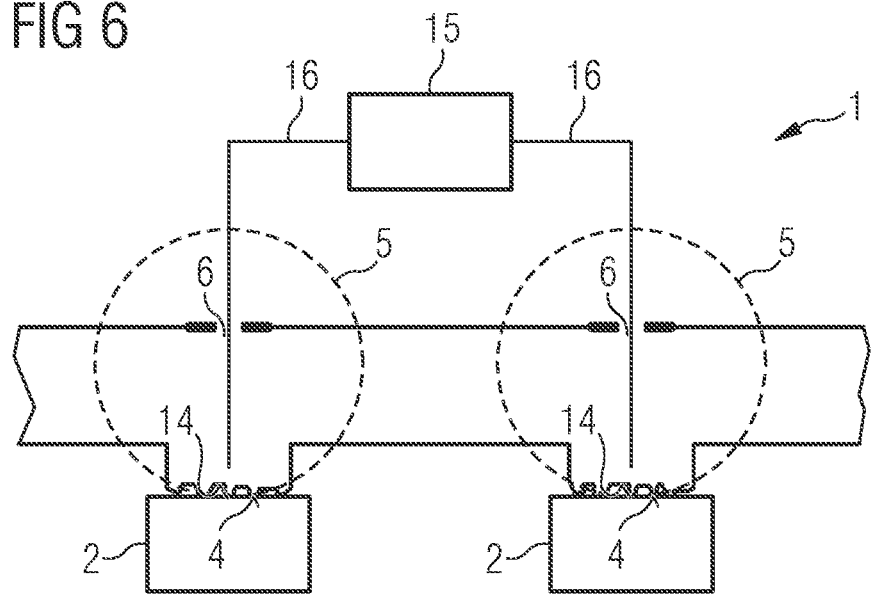

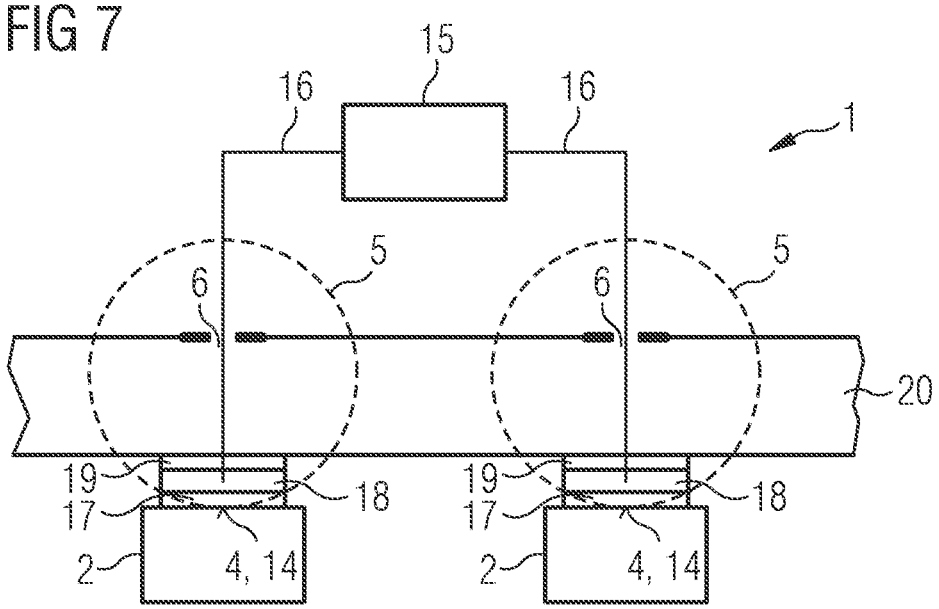
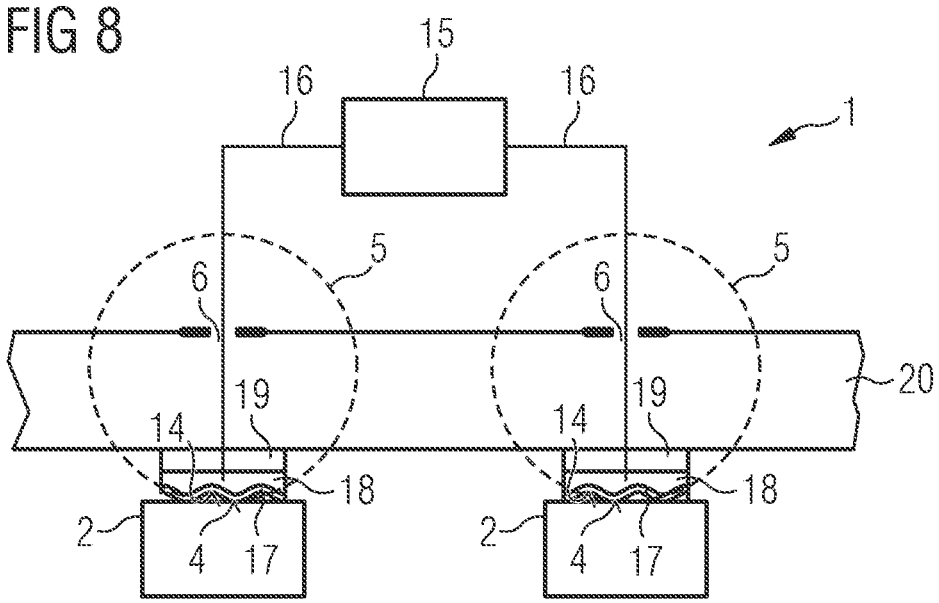

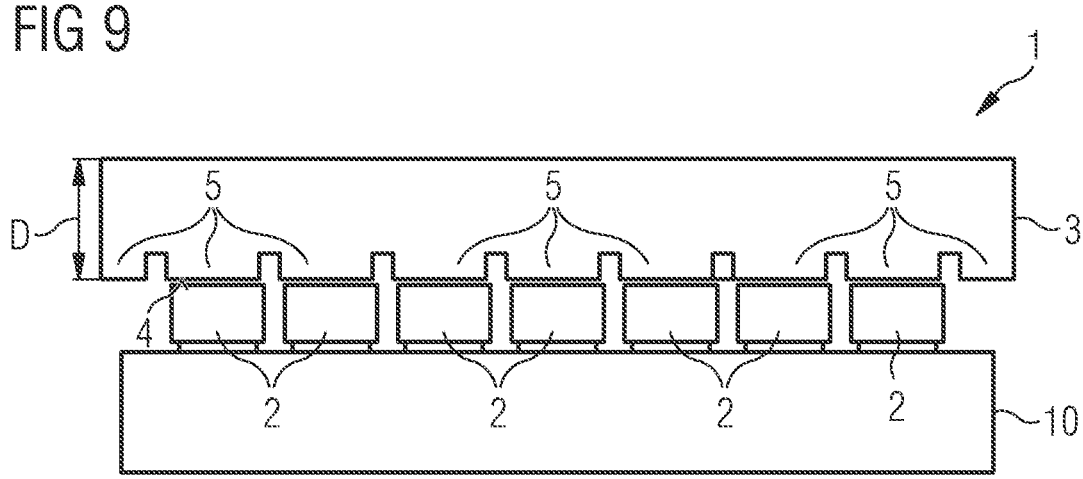
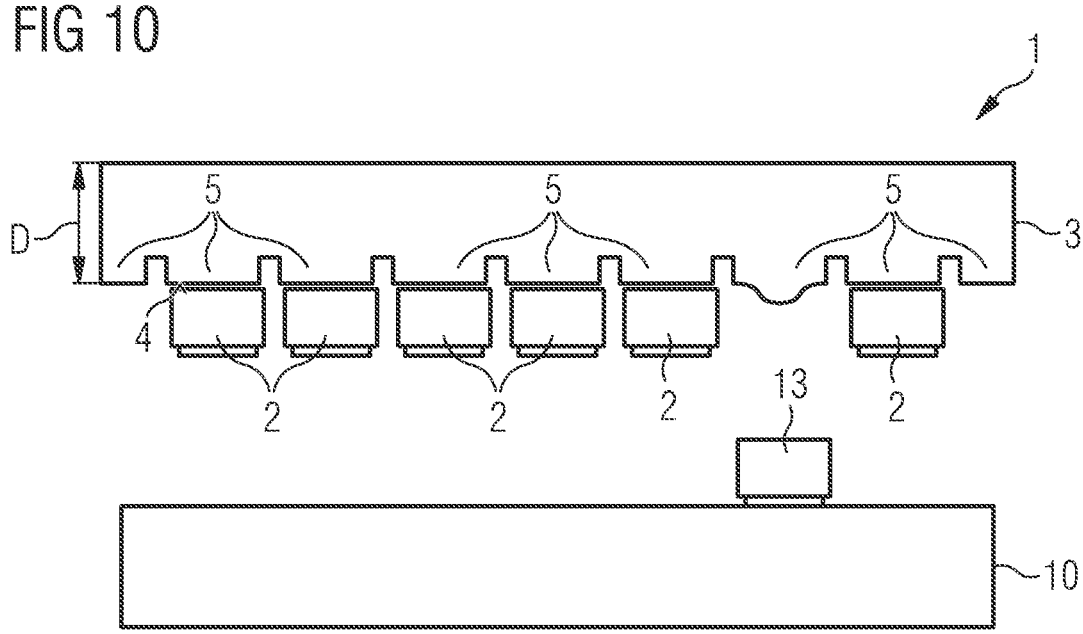

TRANSFER TOOL AND METHOD FOR TRANSFERRING SEMICONDUCTOR CHIPS

This patent application is a national phase filing under section 371 of PCT/EP2019/079071, filed Oct. 24, 2019, which claims the priority of German patent application 102018127123.9, filed Oct. 30, 2018, each of which is incorporated herein by reference in its entirety.

TECHNICAL FIELD

The invention relates to a transfer tool. The invention further relates to a method for transferring semiconductor chips.

SUMMARY OF THE INVENTION

Embodiments provide an improved transfer tool for transferring semiconductor chips. Further embodiments provide a method by which semiconductor chips can be transferred particularly efficiently with the aid of a transfer tool.

Various embodiments provide a transfer tool for transferring a semiconductor chip. The transfer tool is provided to enable and perform a transfer, in particular selective and/or parallel transfer, of at least one, in particular a plurality of semiconductor chips from a source carrier to a target carrier.

The semiconductor chips are, for example, electronic semiconductor chips, in particular optoelectronic semiconductor chips. The optoelectronic semiconductor chip, such as a light-emitting diode chip, a photodiode chip or a laser diode chip, has an epitaxially grown semiconductor layer sequence with an active zone that is suitable for detecting or generating electromagnetic radiation.

According to at least one embodiment, the transfer tool for transferring semiconductor chips comprises an adhesive stamp. The transfer tool may comprise one or more adhesive stamps. The adhesive stamp is the component of the transfer tool on which the semiconductor chip to be transferred is picked up and held during the transfer. It is designed in such a way that it can be pressed against a semiconductor chip without damaging the semiconductor chip.

According to at least one embodiment, the adhesive stamp comprises an adhesive surface for picking up the semiconductor chip. For example, the adhesive stamp comprises a plurality of adhesive surfaces that may be arranged in a manner laterally spaced apart and parallel to each other. The adhesive surface is the surface at which the adhesive stamp is in direct contact with the semiconductor chip during the transfer. The adhesive surface faces the semiconductor chip.

According to at least one embodiment, the transfer tool comprises a device for adjusting a surface area of the adhesive surface. The device for adjusting the surface area of the adhesive surface comprises, for example, at least one pump, a capacitor, an electromagnet and/or a radiation-emitting component such as a light-emitting diode or a laser diode to thereby change the surface area of the adhesive surface and to thereby adjust the surface area. For example, by means of the device, a force can be exerted on the adhesive stamp, which leads to a change in the surface area of the adhesive surface.

According to at least one embodiment, the adhesive stamp is designed to be deformable. This means, for example, that the shape of the adhesive stamp is changed at least in places by the force acting on it. Preferably, the adhesive stamp is formed at least in places with an elastic material such as an elastomer. Particularly preferably, the adhesive stamp returns as completely as possible to an initial shape after deformation.

According to at least one embodiment, the adhesive surface of the adhesive stamp is formed by a part of the outer surface of the adhesive stamp. The outer surface of the adhesive stamp is the surface that bounds the adhesive stamp to the outside. Thus, the outer surface outwardly bounds the three-dimensional body of the adhesive stamp. The adhesive stamp has at least one region of the outer surface that is in direct contact with the adhesive stamp during transfer of the semiconductor chip. This region of the outer surface forms the adhesive surface. It can be formed with an elastomer, for example.

According to at least one embodiment, the surface area of the adhesive surface can be adjusted by deformation of the adhesive stamp. In particular, the surface area of the adhesive surface can be adjusted by the deformable adhesive stamp. This means that the shape of the outer surface of the adhesive stamp can be changed by deformation of the adhesive stamp. A change in the shape of the outer surface causes a change in the surface area of the adhesive surface. The surface area of the region of the adhesive stamp that directly adjoins the semiconductor chip when the latter is transferred is thus reduced or increased by deformation of the adhesive stamp.

According to at least one embodiment, the transfer tool for transferring a semiconductor chip comprises an adhesive stamp, which has an adhesive surface for picking up the semiconductor chip, and a device for adjusting a surface area of the adhesive surface, wherein the adhesive stamp is designed to be deformable and the adhesive surface is formed by a part of the outer surface of the adhesive stamp. The surface area of the adhesive surface can be adjusted by deformation of the adhesive stamp.

According to at least one embodiment, the adhesive surface is designed to be free of interruptions. Free of interruptions means that the adhesive surface is continuous. In particular, the adhesive surface in this case has no recesses. Thus, a recess in the volume portion does not extend to the adhesive surface and in particular does not disrupt the latter. In particular, the recesses do not extend completely through the adhesive stamp.

According to at least one embodiment, the adhesive stamp comprises a deformable volume portion, and the adhesive surface is formed by a part of the outer surface of the volume portion. The volume portion is preferably part of the adhesive stamp and is formed, for example, by elevations or bulges in the body of the adhesive stamp. Preferably, the volume portion is formed with an elastic material such as an elastomer. Advantageously, during operation, the volume portion of the adhesive stamp can be guided particularly close to the semiconductor chips, thus facilitating a transfer of semiconductor chips from a source carrier to a target carrier. For example, the adhesive stamp comprises a plurality of volume portions, which may be laterally spaced apart. For example, the adhesive stamp preferably comprises between 800 and 10000 volume portions.

In particular, the adhesive surface is formed by a part of the outer surface of the volume portion. Preferably, each volume portion comprises exactly one adhesive surface, which is formed by a part of the outer surface of the volume portion. This portion of the outer surface of the volume portion faces the semiconductor chip during transfer and is referred to herein as the "chip pickup surface". The chip pickup surface of the volume portion corresponds, for example, to the adhesive surface in the operating state of the volume portion during which the transfer takes place. In this case, the chip pickup surface is in full-area contact with the associated semiconductor chip. In particular, the chip pickup surface is then planar. The surface area of the adhesive surface is at a maximum. As soon as the surface area of the adhesive surface is reduced by deformation of the volume portion, the adhesive surface is smaller than the chip pickup surface of the volume portion. The chip pickup surface of the volume portion is then curved convexly and/or concavely in places. Here, the convex areas can be separated from each other by concave areas. This means that the concave and convex areas can be arranged alternately, for example. This makes it possible in particular for the chip pickup surface to have elevations and depressions and thus to be curved concavely and convexly—for example in the manner of a corrugated sheet.

In the planar state, the chip pickup surface is rectangular, for example, and has an edge length of between 5 µm and 200 µm. Particularly preferable, the chip pickup surface of the volume portion in the planar state has an edge length of at least 10 µm. Preferably, each adhesive stamp has a plurality of chip pickup surfaces. Preferably, for example, between 800 semiconductor chips and 10000 semiconductor chips inclusive can be transferred per transfer tool. This means that the transfer tool has, for example, between 800 and 10000 chip pickup adhesive surfaces, inclusive.

The edge length of the chip pickup surface of the volume portion of the adhesive stamp in the planar state is advantageously smaller than the edge length of the semiconductor chip. As a result, less force is required during operation to detach the semiconductor chip from the adhesive surface of the volume portion.

According to at least one embodiment, the adhesive stamp comprises an elastic polymer or is formed from an elastic polymer. Preferably, the adhesive stamp comprises an elastomer or is formed from an elastomer. Particularly preferably, the adhesive stamp comprises a silicone or is formed from a silicone. For example, the adhesive stamp comprises polydimethylsiloxane (PDMS) or is formed from PDMS. PDMS is generally transparent, chemically inert, and exhibits high elasticity. In particular, the volume portion may comprise or consist of any of the aforementioned materials.

According to at least one embodiment, the adhesive stamp has an opening. The opening is preferably arranged transversely or perpendicularly to a main extension plane of the adhesive stamp. The opening is at least partially surrounded by the material of the adhesive stamp and has an aperture lying opposite the chip pickup surface of the volume portion. For example, the opening is located in the volume portion, above the chip pickup surface.

According to at least one embodiment, the device for adjusting the surface area of the adhesive surface is configured to adjust a volume of the opening. The volume of the opening can be adjusted, for example, by external forces. Through the aperture of the opening, a pressure within the adhesive stamp can be changed by means of the device of the transfer tool, such as a pump. This deforms the adhesive stamp, which in turn allows the surface area of the adhesive surface to be adjusted.

According to at least one embodiment, the device for adjusting the surface area of the adhesive surface is configured to adjust a quantity of a filling material in the opening. The filling material is preferably a liquid or a gas. For example, the filling material may be an oil, water or air. Preferably, the pressure of the filling material in the opening is changed by the device, for example a pump of the transfer tool. Preferably, the pressure is transferred to the adhesive stamp, causing it to deform. This changes the shape of the chip pickup surface of the volume portion, resulting in a change in the adhesive surface.

For example, during operation, the volume portion inflates by applying external pressure and deforms the chip pickup surface of the volume portion, which is the surface facing the semiconductor chip. The deformation of the chip pickup surface of the volume portion adjusts the surface area of the adhesive surface.

For setting down transferred semiconductor chips, the surface area of the adhesive surface is reduced. This is achieved by deforming the chip pickup surface. For example, the shape of the chip pickup surface changes from planar to convexly curved. Since the semiconductor chips are stiff, the semiconductor chips cannot follow the deformation of the chip pickup surface of the volume portion during operation and become detached.

The pressure can advantageously be varied; on the one hand, the pressure on the filling material in the opening can be increased or decreased. This allows a convex or concave shape of the chip pickup surface to be adjusted. Both shapes lead to a reduction in the adhesive surface area.

How much the chip pickup surface of the volume portion needs to be deformed to release the semiconductor chip from the adhesive surface depends on a thickness of the semiconductor chips, the material of the adhesive surface of the adhesive stamp as well as the semiconductor chip material, the interaction energy from the semiconductor chip to the adhesive surface, and the speed of adjusting the surface area of the adhesive surface of the adhesive stamp.

In particular, the surface area of the adhesive surface can be specifically adjusted during operation by the device of the transfer tool. For example, the semiconductor chips are examined prior to transfer, for example with regard to their quality or other specifiable properties. With the method described here, it is then possible for the chip pickup surfaces to be individually adjusted in shape. This makes it possible to selectively transfer semiconductor chips. Semiconductor chips of certain quality or with certain properties can thus be transferred. For example, defective semiconductor chips can be sorted out and only intact semiconductor chips transferred or vice versa.

According to at least one embodiment, the adhesive stamp has a deformation portion laterally adjacent to the volume portion. The deformation portion is part of the adhesive stamp and is mechanically connected to the volume portion of the adhesive stamp. The deformation portion is located, for example, between two adjacent volume portions. For example, the deformation portion may comprise another material that is different from the material of the volume portion. For example, the deformation portion comprises a material with a higher coefficient of elasticity compared to the material of the volume portion. Alternatively, it is possible that the volume portion and the deformation portion are formed with the same material.

According to at least one embodiment, a thickness of the adhesive stamp in the deformation portion is smaller compared to a thickness of the adhesive stamp in the volume portion. The thickness of the adhesive stamp is determined transversely or perpendicularly to a main extension plane of the adhesive stamp. The thickness of the deformation portion depends on the distance between adjacent volume portions. For example, the thickness of the deformation portion is similar in size to the distance between adjacent volume portions. Preferably, the distance of adjacent volume portions from each other is at least three times as large as the chip pickup surface. The advantage resulting from the difference in thickness is that, during operation, the volume portion of the adhesive stamp can be guided particularly close to the semiconductor chips, thus facilitating a transfer of semiconductor chips from a source carrier to a target carrier. Furthermore, due to the reduced thickness, the deformation portion can be deformed with less force than a deformation portion of greater thickness.

According to at least one embodiment, the adhesive stamp has a cavity in the deformation portion. The cavity is completely surrounded by the material of the deformation portion and preferably has no aperture. Due to the cavity, the deformation portion of the adhesive stamp can be deformed with less force than compared to a deformation portion without a cavity.

According to at least one embodiment, the device for adjusting the surface area of the adhesive surface is configured to exert a force on the adhesive stamp in the deformation portion which is directed transversely or perpendicularly to the main extension plane of the adhesive stamp. The main extension plane is parallel to the adhesive surface and thus the adhesive surface runs transverse or perpendicular to the force acting on the deformation portion of the adhesive stamp.

During operation, the deformation portion is deformed by the external force of the device of the transfer tool. The deformation of the deformation portion is transferred to the laterally adjacent volume portion. This, in turn, deforms the chip pickup surface of the volume portion and thus adjusts the surface area of the adhesive surface of the adhesive stamp. The force to be applied, which is required for deforming the chip pickup surface of the volume portion, is preferably particularly small in the deformation portion. For example, the force required to deform the chip pickup surface of the volume portion is in particular smaller in the deformation portion than the force required for direct deformation of the volume portion.

According to at least one embodiment, the force is a magnetic force or an electrostatic force. The device for exerting the force comprises, for example, an electromagnet or a capacitor. If electrostatic or magnetic force is exerted on the deformation portion by the device of the transfer tool during operation, this deformation of the deformation portion is transferred to the volume portion of the adhesive stamp, which deforms the chip pickup surface of the volume portion and thus reduces the surface area of the adhesive surface of the adhesive stamp.

According to at least one embodiment, the adhesive stamp has a metal layer on its outer surface. The metal layer may comprise the following conductive materials such as, for example, graphene, cobalt, silver, copper, aluminum, tungsten, iron, steel, graphite. Ferromagnetic materials for the metal layer may include materials with a Curie temperature below room temperature, for example iron, nickel, cobalt, gadolinium, and dysprosium. In addition, soft ferrites based on ferrites with metals, for example manganese, cobalt, nickel, copper, zinc or cadmium, and hard ferrites, for example nickel, zinc, cobalt, manganese zinc, barium or strontium, and other magnetic materials can be used. The metal layer is preferably arranged in the field of the electromagnet or capacitor. The metal layer is used to transfer magnetic or electrostatic forces from the outside by means of the device of the transfer tool.

According to at least one embodiment, the metal layer is arranged in the deformation portion. The metal layer is located, for example, on the outer surface of the deformation portion of the adhesive stamp. The outer surface of the deformation portion runs in particular parallel to the main extension plane of the adhesive stamp.

According to at least one embodiment, the device for adjusting the surface area of the adhesive surface is configured to change a density of a material of the volume portion. In the operating state, the material has a lower density during pickup of the semiconductor chip than during detachment of the semiconductor chip from the adhesive surface. The higher density deforms the volume portion, which in turn changes the surface area of the adhesive surface and promotes detachment of the semiconductor chip from the adhesive surface.

According to at least one embodiment, the volume portion comprises a photoisomerizable material or consists of a photoisomerizable material. Here, on the one hand, the complete volume portion and the chip pickup surface may comprise the photoisomerizable material or, on the other hand, only a portion of the volume portion may comprise the photoisomerizable material. For example, the chip pickup surface may comprise a different material than the material of the portion of the volume portion formed with the photoisomerizable material. Preferably, the chip pickup surface comprises a material that has good adhesion for picking up the semiconductor chip and that allows the semiconductor chip to be easily detached when the chip pickup surface is deformed. A suitable material for this purpose can be polydimethylsiloxane, for example.

Photoisomerizable materials are materials in which regions can be oriented by electromagnetic radiation to adjust the density of the material. The photoisomerizable material can be, for example, an azo-functionalized liquid crystal elastomer. For example, the cis-trans isomerism of azobenzenes or stilbenes can be made use of.

According to at least one embodiment, the volume portion comprises a second layer formed with the photoisomerizable material, wherein a first layer, which is free of the photoisomerizable material, is applied to this layer on the side facing the adhesive surface. The first layer preferably comprises an elastic polymer or is formed from an elastic polymer. For example, the first layer is formed from polydimethylsiloxane and includes the adhesive surface or chip pickup surface. The second layer, on the other hand, comprises a photoisomerizable material or consists of a photoisomerizable material. During operation, the second layer can be deformed, and the deformation is transferred to the first layer, thereby adjusting the surface area of the adhesive surface. The deformed chip pickup surface then exhibits a plurality of concave and convex deformations. For example, the chip pickup surface is corrugated or wrinkled.

Additionally, the volume portion may comprise a third layer and a base. The third layer and the base can be formed with other materials than the first and/or the second layer.

According to at least one embodiment, the device for adjusting the surface area of the adhesive surface is configured to guide electromagnetic radiation to the photoisomerizable material of the volume portion. The device may comprise at least one light-emitting diode or a laser diode which generates electromagnetic radiation from the spectral range from infrared radiation to UV radiation during operation. Further, the device may comprise a light guide that guides portions of the electromagnetic radiation to the volume portion. For example, the light guide may extend through an opening in the volume portion. During operation, the electromagnetic radiation acts on the photoisomerizable material of the volume portion and causes the volume contraction of the adhesive stamp. The deformation of the volume portion thus changes the surface area of the adhesive surface of the adhesive stamp, which is reduced.

According to at least one embodiment, the deformation of the volume portion adjusts the surface area of the adhesive surface. By deformation of the volume portion, the chip pickup surface of the volume portion is deformed in such a way that preferably a concave and/or convex chip pickup surface of the volume portion is formed. This adjusts and advantageously reduces the surface area of the adhesive surface. Hereby, the detachment of the semiconductor chips is promoted. The opening in the volume portion and/or the cavity in the deformation portion have the consequence that the deformable volume portion, in particular the chip pickup surface of the volume portion, has a concave and/or a convex deformation. Advantageously, the semiconductor chips can be placed on the target carrier in this way without shear movements and the material for the surface of the target carrier can be selected more freely.

Furthermore embodiments provide a method for transferring semiconductor chips. This means that all features disclosed for the transfer tool are also disclosed for the method for transferring semiconductor chips and vice versa.

According to at least one embodiment of the method for transferring semiconductor chips, a transfer tool is provided. The transfer tool is in particular a transfer tool described herein.

According to at least one embodiment of the method, a plurality of semiconductor chips is provided, in particular in a regular arrangement, on a source carrier. The source carrier is, for example, a wafer with semiconductor chips on a growth substrate or on an auxiliary carrier or an artificial wafer with already presorted semiconductor chips.

According to at least one embodiment of the method, the transfer tool is brought close to the source carrier, an adhesive surface of the volume portion coming into contact with a semiconductor chip.

According to at least one embodiment of the method, the semiconductor chip adheres to the adhesive surface of the volume portion via Van der Waals forces. In particular, the semiconductor chip then adheres to the adhesive surface of the volume portion exclusively due to Van der Waals forces. The chip pickup surface of the volume portion is preferably planar during adhesion, since the semiconductor chip also has a planar, rigid surface. This advantageously facilitates adhesion. The semiconductor chip is bonded over its entire surface to the chip pickup surface of the volume portion.

In particular, selected chip pickup surfaces of the volume portion can be specifically adjusted by the device of the transfer tool to prevent pickup of defective semiconductor chips. In this case, the surface area of the adhesive surface is selectively adjusted by the device of the transfer tool. The surface area of the adhesive surface of the volume portion is reduced and the chip pickup surface of the volume portion is deformed concavely and/or convexly. The pickup of selected, preferably defective semiconductor chips is thus no longer possible.

According to at least one embodiment of the method, the transfer tool is lifted off the source carrier. A plurality of the semiconductor chips adhere to the adhesive surfaces of the volume portions of the adhesive stamp.

According to at least one embodiment of the method, the transfer tool is brought close to the target carrier, the semiconductor chips arranged on the transfer tool coming into contact with the target carrier.

According to at least one embodiment of the method, the semiconductor chips are detached from the adhesive surface by reducing the surface area of the adhesive surface of the volume portion of the adhesive stamp. By means of the device of the transfer tool, for example, a force perpendicular or transverse to the main extension plane is exerted on the deformation portion or volume portion of the adhesive stamp. As a result, the chip pickup surface of the volume portion deforms concavely and/or convexly, the surface area of the adhesive surface is reduced, and the semiconductor chip is at least partially in contact with the chip pickup surface of the volume portion. Thus, the rigid semiconductor chip can preferably be detached. The semiconductor chip subsequently dwells on the target carrier.

According to at least one embodiment of the method for transferring semiconductor chips, a transfer tool is first provided. Subsequently, a plurality of semiconductor chips are provided in a regular arrangement on a source carrier, and the transfer tool is brought close to the source carrier, an adhesive surface of the volume portion coming into contact with a semiconductor chip. In a next step, the semiconductor chip adheres to the adhesive surface of the volume portion via Van der Waals forces, and then the transfer tool lifts off the source carrier. In a final step, the transfer tool is brought close to the target carrier, the semiconductor chips arranged on the transfer tool coming into contact with the target carrier, and the semiconductor chips are detached by reducing the surface area of the adhesive surface of the volume portion.

One idea underlying the present transfer tool is to specify a deformable adhesive stamp that can be deformed by the device of the transfer tool. This adjusts the surface area of the adhesive surface of the deformable adhesive stamp and thus enables the removal of the semiconductor chips from the chip pickup surface of the volume portion.

The idea is to achieve good adhesion between the adhesive stamp and the semiconductor chip when removing it from the source carrier, and when setting the semiconductor chips down on the target carrier the adhesion between the adhesive surface of the adhesive stamp and the semiconductor chip must be low. Advantageously, shear movements during placement of the semiconductor chips can be dispensed with and the material for the surface of the target carrier can thus be selected more freely.

A particular advantage of this method for transferring semiconductor chips is that the method enables selective transfer of selected semiconductor chips. This means that by means of the method not all semiconductor chips provided on the source carrier have to be transferred. Instead, the method enables only a selected part of the semiconductor chips arranged on the source carrier to be transferred. This makes it possible, for example, to transfer only semiconductor chips known to be functional and to leave semiconductor chips known to be defective on the source carrier. The selected part of the semiconductor chips, for example as functional semiconductor chips, can then be transferred simultaneously from the source carrier to the target carrier.

Advantageously, this method enables several semiconductor chips to be transferred simultaneously, i.e. in the same transfer step. This means that many semiconductor chips can be transferred from a source carrier to a target carrier cost-effectively and in a short time using this method.

BRIEF DESCRIPTION OF THE DRAWINGS

Further advantageous embodiments and further developments of the transfer tool and the method for transferring semiconductor chips will be illustrated by the following exemplary embodiments described in connection with the figures.

FIGS. 1, 2 each show a schematic sectional view of a transfer tool according to an exemplary embodiment of a transfer tool described herein in two different operating states;

FIGS. 5, 6 each show a schematic sectional view of a transfer tool according to an exemplary embodiment of a transfer tool described herein in two different operating states;

FIGS. 7, 8 each show a schematic sectional view of a transfer tool according to an exemplary embodiment of a transfer tool described herein in two different operating states; and FIGS. 9, 10, 11 and 12 show schematic sectional views of various method stages of a method for transferring semiconductor chips according to an exemplary embodiment of a method described herein.

DETAILED DESCRIPTION OF ILLUSTRATIVE EMBODIMENTS

Figure 3:
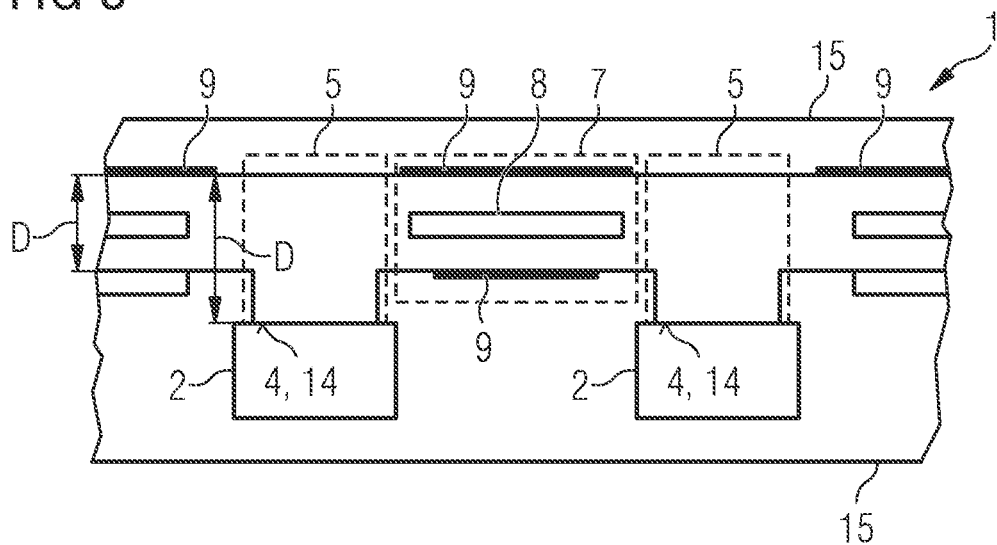
FIGS. 3, 4 each show a schematic sectional view of a transfer tool according to an exemplary embodiment of a transfer tool described herein in two different operating states.

Elements that are identical, similar or have the same effect are provided with the same reference signs in the figures. The figures and the proportions of the elements shown in the figures are not to be regarded as true to scale. Rather, individual elements, in particular layer thicknesses, may be shown exaggeratedly large for better representability and/or understanding.

The transfer tool 1 according to the exemplary embodiment of FIG. 1 comprises a device 15 for adjusting the surface area of the adhesive surface 4 and a deformable adhesive stamp 3.

The adhesive stamp 3 comprises an elastic polymer or is formed from an elastic polymer. The adhesive stamp 3 comprises a volume portion 5, which comprises an opening 6. The opening 6 is arranged transversely or perpendicularly to the main extension plane of the adhesive stamp 3. The opening 6 is at least partially surrounded by the material of the adhesive stamp 3 and has an aperture lying opposite a chip pickup surface 14 of the volume portion 5. The opening 6 is located in the volume portion 5, above the chip pickup surface 14.

The chip pickup surface 14 faces a semiconductor chip 2. The semiconductor chip 2 has a larger edge length than the edge length of the chip pickup surface 14 of the volume portion 5. In the exemplary embodiment of FIG. 1, the chip pickup surface 14 is in full-area contact with the semiconductor chip 2. The chip pickup surface 14 is planar in the operating state of the transfer tool shown in FIG. 1. This corresponds to the operating state of the chip pickup surface 14 during a transfer of the semiconductor chip 2. In this operating state, the chip pickup surface 14 of the volume portion 5 corresponds to an adhesive surface 4. The surface area of the adhesive surface 4 is at a maximum in this operating state.

In contrast to FIG. 1, in the operating state of the transfer tool shown in FIG. 2, a filling material 12 is located in the opening 6 of the volume portion 5. The filling material 12 comprises, for example, oils, water or other liquids or gases. By means of the device 15, for example at least one pump, of the transfer tool 1, a force is exerted on the filling material 12. The force is transferred to the adhesive stamp 3, causing the volume portion 5 of the adhesive stamp to deform. As a result, the shape of the chip pickup surface 14 of the volume portion 5 changes, which leads to a change in the surface area of the adhesive surface 4. Due to the deformation of the volume portion 5, the surface area of the adhesive surface 4 is reduced in this operating state compared to the operating state shown in FIG. 1.

In the operating state of the exemplary embodiment of FIG. 2, the chip pickup surface 14 is not in full-area contact with the semiconductor chip 2. The chip pickup surface 14 has a convex shape due to the deformation of the adhesive stamp 3. This corresponds to the state of the chip pickup surface 14 during a detachment of the semiconductor chip 2 from the adhesive surface 4. The chip pickup surface 14 of the volume portion 5 is larger than the adhesive surface 4 in this operating state.

The transfer tool 1 according to the exemplary embodiment of FIG. 3 comprises a device 15 for adjusting the surface area of the adhesive surface 4 and a deformable adhesive stamp 3. The adhesive stamp 3 comprises a deformation portion 7. The deformation portion 7 is part of the adhesive stamp 3 and is located between each two adjacent volume portions 5. The deformation portion 7 may, for example, comprise a further material which is different from the material of the volume portion or may consist of the same material as the volume portion. The deformation portion 7 of the adhesive stamp 3 has a smaller thickness D compared to a thickness D of the adhesive stamp 3 in the volume portion 5. The adhesive stamp 3 in FIG. 3 has a cavity 8 in the deformation portion 7. The cavity 8 is completely surrounded by the material of the deformation portion 7 and has no aperture. A metal layer 9 is arranged on the outer surface of the adhesive stamp 3, in particular on the outer surface of the deformation portion 7. The metal layer 9 serves to transfer magnetic or electrostatic forces from the outside to the deformation portion 7 by means of the device 15 of the transfer tool 1. The device 15 for exerting the force comprises an electromagnet or a capacitor, for example.

The chip pickup surface 14 faces the semiconductor chip 2. In the exemplary embodiment of FIG. 3, the chip pickup surface 14 is in full-area contact with the semiconductor chip 2. The chip pickup surface 14 is planar. This corresponds to the state of the chip pickup surface 14 during a transfer of the semiconductor chip 2. In this operating state, the chip pickup surface 14 of the volume portion 5 corresponds to an adhesive surface 4. The semiconductor chip 2 has a larger edge length than the edge length of the chip pickup surface 14 of the volume portion 5. The surface area of the adhesive surface 4 is at a maximum in this operating state.

Figure 4:
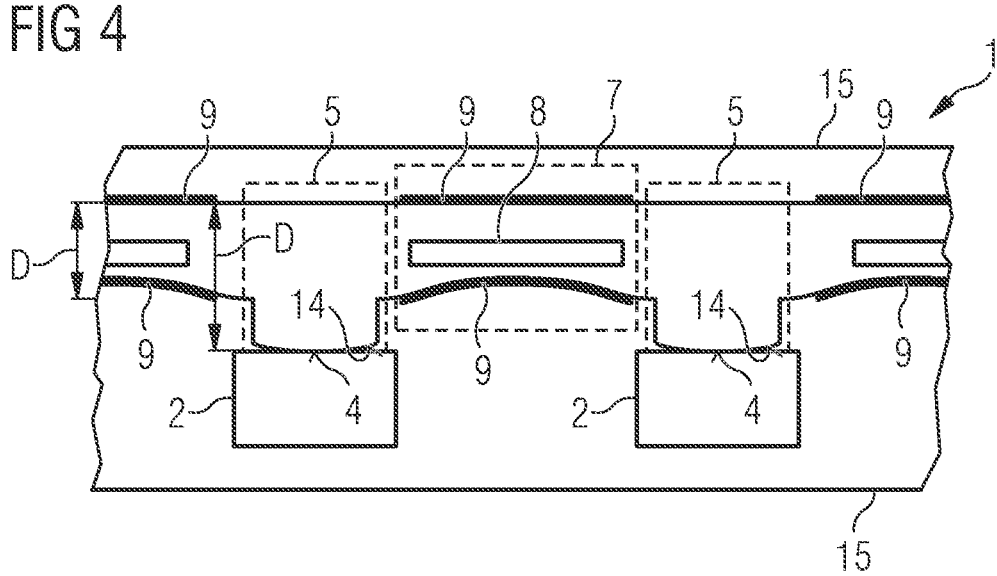

The exemplary embodiment shown in FIG. 4 features the transfer tool 1 in an operating state that differs from the operating state of the transfer tool 1 in FIG. 3 in that a magnetic or electrostatic force of the device 15 is exerted on the deformation portion 7. The force is directed transversely or perpendicularly to the main extension plane of the adhesive stamp 3. As a result of this force acting on the deformation portion 7 of the adhesive stamp 3, the deformation portion 7 is deformed. This deformation is transferred to the volume portion. This finally adjusts the surface area of the adhesive surface 4.

In the exemplary embodiment of FIG. 4, the chip pickup surface 14 is not in full-area contact with the semiconductor chip 2. The chip pickup surface 14 is convex due to the deformation of the adhesive stamp 3. This corresponds to the state of the chip pickup surface 14 during detachment of the semiconductor chip 2 from the adhesive surface 4. The chip pickup surface 14 of the volume portion 5 is larger than the adhesive surface 4 in this operating state. The surface area of the adhesive surface 4 is reduced in this operating state due to the deformation of the deformation portion 7.

The transfer tool 1 according to the exemplary embodiment of FIG. 5 comprises a device 15 for adjusting the surface area of the adhesive surface 4 and a deformable adhesive stamp 3. The adhesive stamp 3 comprises a volume portion 5. The volume portion 5 comprises a photoisomerizable material or consists of a photoisomerizable material. The photoisomerizable material is, for example, an azo-functionalized liquid crystal elastomer. Here, for example, the cis-trans isomerism of azobenzenes and stilbenes can be made use of. The volume portion 5 may consist entirely of the photoisomerizable material. Alternatively, it is possible that only an intermediate layer of the volume portion 5 is formed with the photoisomerizable material. At a chip pickup surface 14, the volume portion 5 may then be formed with another material such as a polydimethylsiloxane.

In this exemplary embodiment, the device 15 for performing deformation of the volume portion 5 comprises a light-emitting diode or a laser diode which generates electromagnetic radiation from the spectral range from infrared radiation to UV radiation during operation. Further, the device may comprise a light guide 16 that guides portions of the electromagnetic radiation to the volume portion 5. For example, the light guide may extend through an opening 6 in the volume portion 5.

The chip pickup surface 14 faces a semiconductor chip 2. In the exemplary embodiment of FIG. 5, the chip pickup surface 14 is in full-area contact with the semiconductor chip 2. The chip pickup surface 14 is planar. This corresponds to the state of the chip pickup surface 14 during a transfer of the semiconductor chip 2. In this operating state, the chip pickup surface 14 of the volume portion 5 corresponds to an adhesive surface 4. The semiconductor chip 2 has a larger edge length than the edge length of the chip pickup surface 14 of the volume portion 5. The surface area of the adhesive surface 4 is at a maximum in this operating state.

The exemplary embodiment shown in FIG. 6 features the transfer tool 1 in an operating state that differs from the operating state of the transfer tool 1 in FIG. 5 in that electromagnetic radiation is directed onto the volume portion 5. Due to the electromagnetic radiation on the photoisomerizable material of the volume portion 5, a volume contraction takes place. This means that the density of the photoisomerizable material is increased. Due to the change in density and thus volume, the adhesive surface 4 is deformed. The chip pickup surface 14 exhibits a plurality of concave and convex deformations. For example, the chip pickup surface 14 is corrugated.

In the exemplary embodiment of FIG. 6, the chip pickup surface 14 is not in full-area contact with the semiconductor chip 2. This corresponds to the state of the chip pickup surface 14 during a detachment of the semiconductor chip 2 from the adhesive surface 4. The chip pickup surface 14 of the volume portion 5 is larger than the adhesive surface 4 in this operating state. The surface area of the adhesive surface 4 is reduced in this operating state due to the deformation of the volume portion 5.

The transfer tool 1 according to the exemplary embodiment of FIG. 7 comprises a device 15 for adjusting the surface area of the adhesive surface 4 and a deformable adhesive stamp 3. The adhesive stamp 3 comprises a volume portion 5. The volume portion 5 comprises a plurality of layers, a first layer 17, a second layer 18, a third layer 19, and a base 20. The first layer 17 comprises the chip pickup surface 14 and is in direct contact with the second layer 18.

The second layer 18 is in direct contact with the third layer 19, and the third layer 19 is directly bonded to the base 20.

The first layer 17 comprises an elastic polymer or is formed from an elastic polymer. The second layer 18 comprises a photoisomerizable material or consists of a photoisomerizable material. Additionally, the third layer 19 and the base 20 may each be formed with other materials than the first and/or the second layer.

In this exemplary embodiment, the device 15 for performing deformation of the volume portion 5 comprises a light-emitting diode or a laser diode which generates electromagnetic radiation from the spectral range from infrared radiation to UV radiation during operation. Further, the device may comprise a light guide 16 that guides portions of the electromagnetic radiation to the photoisomerizable second layer 18. For example, the light guide may extend through an opening 6 in the volume portion 5.

The chip pickup surface 14 faces a semiconductor chip 2. In the exemplary embodiment of FIG. 7, the chip pickup surface 14 is in full-area contact with the semiconductor chip 2. The chip pickup surface 14 is planar. This corresponds to the state of the chip pickup surface 14 during a transfer of the semiconductor chip 2. In this operating state, the chip pickup surface 14 of the volume portion 5 corresponds to an adhesive surface 4. The semiconductor chip 2 has a larger edge length than the edge length of the chip pickup surface 14 of the volume portion 5. The surface area of the adhesive surface 4 is at a maximum in this operating state.

The exemplary embodiment shown in FIG. 8 features the transfer tool 1 in an operating state that differs from the operating state of the transfer tool 1 in FIG. 7 in that electromagnetic radiation is directed onto the volume portion 5. Due to the electromagnetic radiation on the photoisomerizable material of the second layer 18 of the volume portion 5, a volume contraction takes place. This means that the density of the photoisomerizable material of the second layer 18 is increased. Due to the change in density and thus volume, the adhesive surface 4 is deformed. The chip pickup surface 14 exhibits a plurality of concave and convex regions. For example, the chip pickup surface 14 is corrugated or wrinkled.

The chip pickup surface 14 is not in full-area contact with the semiconductor chip 2 in the exemplary embodiment of FIG. 8. This corresponds to the state of the chip pickup surface 14 during a detachment of the semiconductor chip 2 from the adhesive surface 4. The chip pickup surface 14 of the volume portion 5 is larger than the adhesive surface 4 in this operating state. The surface area of the adhesive surface 4 is reduced in this operating state due to the deformation of the volume portion 5.

FIGS. 9, 10, 11 and 12 show, by means of schematic sectional views, various method stages of a method for transferring semiconductor chips according to an exemplary embodiment of a method described herein. The device 15 as well as the openings 6 and cavities 8 are not shown in FIGS. 9 to 12 for the sake of clarity.

In the method for transferring semiconductor chips 2 according to the exemplary embodiment of FIGS. 9 to 12, in a first step the transfer tool 1 is brought close to the semiconductor chips 2 in such a way that the volume portions 5 with their adhesive surface 4 are in direct contact with the semiconductor chips 2 arranged on a source carrier 10, FIG. 9. The semiconductor chips 2 are arranged in a regular arrangement, for example along rows and columns, on the source carrier 10. The transfer tool 1 is brought close to an upper surface of the source carrier 10 such that each volume portion 5 of the adhesive stamp 3 is arranged above the respective associated semiconductor chip 2 on the upper surface of the source carrier 10. The chip pickup surface 14 is in full-area contact with the semiconductor chip 2. The chip pickup surface 14 is planar. The chip pickup surface 14 of the volume portion 5 corresponds to the adhesive surface 4. The surface area of the adhesive surface 4 is at a maximum in this operating state.

The transfer tool 1 moves away from the source carrier 10, FIG. 10. The semiconductor chips 2 adhere to the adhesive surface 4 of the volume portion 5 via Van der Waals forces. If a defective semiconductor chip 13 is present on the source carrier 10, specifically this chip can adhere not to the adhesive surface 4 of the adhesive stamp 3. The transfer tool 1 can be adjusted by means of the device 15 in such a way that the chip pickup surface 14 of the volume portion 5 of the adhesive stamp 3 can be specifically deformed and an adhesion of the semiconductor chips 2 can be specifically adjusted.

Figure 11:
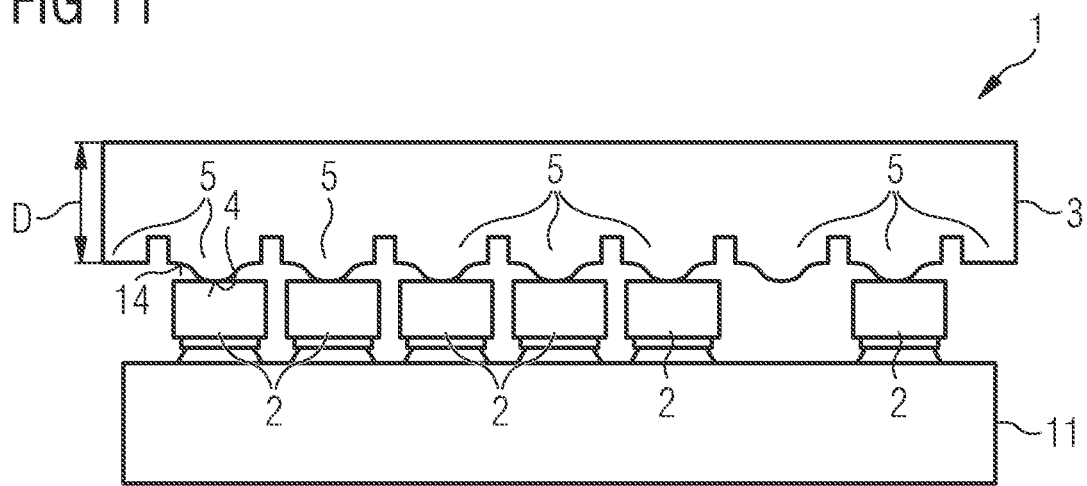

In a next step, the transfer tool 1 with the semiconductor chips 2 is brought close to a target carrier 11, FIG. 11. The semiconductor chips 2 arranged on the transfer tool 1 are in direct contact with the target carrier 11, with the undersides of the semiconductor chips 2 facing an upper surface of the target carrier 11. The semiconductor chips 2 are detached by reducing the surface area of the adhesive surface 4 of the volume portion 5. The surface area of the adhesive surface 4 of the volume portion 5 is reduced by the device 15 of the transfer tool 1. The chip pickup surface 14 is convex in shape. The rigid semiconductor chips 2 become detached from the convex chip pickup surface 14 of the volume portion 5 and remain on the target carrier 11.

Figure 12:
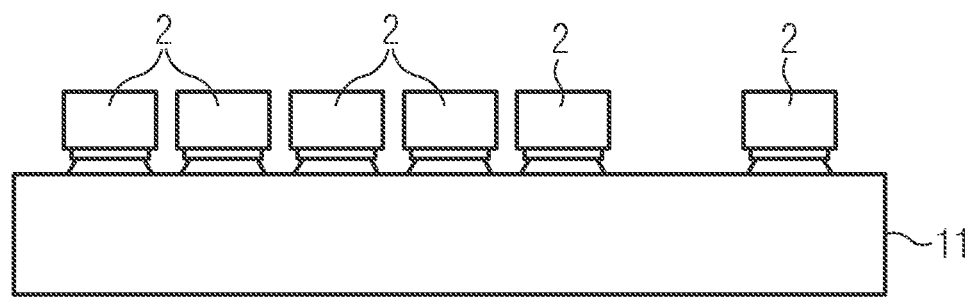

The transfer tool 1 is lifted off the target carrier 11, FIG. 12. The semiconductor chips 2 previously attached to the adhesive surface 4 of the volume portion 5 of the adhesive stamp 3 remain on the upper surface of the target carrier 11. The transfer of the semiconductor chips 2 from the source carrier 10 to the target carrier 11 is thus completed.

By means of the method described here, it is possible in a particularly simple manner to transfer semiconductor chips in a targeted and selective manner.

The features and exemplary embodiments described in connection with the figures can be combined with each other according to further exemplary embodiments, even if not all combinations are explicitly described. Furthermore, the exemplary embodiments described in connection with the figures may alternatively or additionally have further features according to the description in the general part.

The invention is not limited to the exemplary embodiments by the description based on the same. Rather, the invention encompasses any new feature as well as any combination of features, which in particular includes any combination of features in the patent claims, even if this feature or combination itself is not explicitly specified in the patent claims or embodiments.

The invention claimed is:

1. A transfer tool comprising:
an adhesive stamp having an adhesive surface configured to pick up a semiconductor chip,
wherein the adhesive stamp is deformable,
wherein the adhesive stamp comprises an elastic polymer,
wherein the adhesive surface is formed by a part of an outer surface of the adhesive stamp,
wherein a surface area of the adhesive surface is adjustable by deformation of the adhesive stamp, and
wherein the adhesive surface is free of interruptions; and
a device configured to adjust the surface area of the adhesive surface,
wherein the transfer tool is configured to transfer the semiconductor chip.

2. The transfer tool according to claim 1, wherein the adhesive stamp has an opening, and wherein the device is configured to adjust a volume of the opening.

3. The transfer tool according to claim 2, wherein the device is configured to adjust an amount of a filling material in the opening.

4. The transfer tool according to claim 1, wherein the adhesive stamp comprises a deformable volume portion, and wherein the adhesive surface is a part of an outer surface of the volume portion.

5. The transfer tool according to claim 4, wherein the adhesive stamp has a deformation portion laterally adjacent to the volume portion.

6. The transfer tool according to claim 5, wherein a thickness of the adhesive stamp in the deformation portion is reduced relative to a thickness of the adhesive stamp in the volume portion.

7. The transfer tool according to claim 5, wherein the adhesive stamp has a cavity in the deformation portion.

8. The transfer tool according to claim 5, wherein the device is configured to exert a force on the adhesive stamp in the deformation portion, which is directed transversely or perpendicularly to a main extension plane of the adhesive stamp.

9. The transfer tool according to claim 8, wherein the force is a magnetic or an electrostatic force.

10. The transfer tool according to claim 4, wherein the device is configured to change a density of a material of the volume portion.

11. The transfer tool according to claim 4, wherein the volume portion comprises a photoisomerizable material.

12. The transfer tool according to claim 11, wherein the volume portion comprises a second layer formed with the photoisomerizable material, wherein a first layer, which is free of the photoisomerizable material, is located at the second layer on a side facing the adhesive surface.

13. The transfer tool according to claim 12, wherein the device is configured to guide electromagnetic radiation to the volume portion.

14. The transfer tool according to claim 4, wherein the surface area of the adhesive surface is adjustable by deformation of the volume portion.

15. The transfer tool according to claim 1, further comprising a metal layer located on the outer surface of the adhesive stamp.

16. The transfer tool according to claim 15, wherein the metal layer is arranged in a deformation portion.

17. A method for transferring a plurality of semiconductor chips, the method comprising:
providing the plurality of semiconductor chips in a regular arrangement on a source carrier;
bringing the transfer tool of claim 1 close to the source carrier so that an adhesive surface of a volume portion contacts the plurality of semiconductor chips;

adhering the plurality of semiconductor chips to the adhesive surface of the volume portion via Van der Waals forces;

lifting the transfer tool away from the source carrier;

moving the transfer tool close to a target carrier so that the plurality of semiconductor chips arranged on the transfer tool come into contact with the target carrier; and detaching the plurality of semiconductor chips by reducing the surface area of the adhesive surface of the volume portion.

18. A transfer tool comprising:

an adhesive stamp having an adhesive surface configured to pick up a semiconductor chip; and a device configured to adjust a surface area of the adhesive surface, wherein the adhesive stamp is deformable, wherein the adhesive surface is formed by a part of an outer surface of the adhesive stamp, wherein the surface area of the adhesive surface is adjustable by deformation of the adhesive stamp, wherein the adhesive surface is free of interruptions, wherein the adhesive stamp has a deformation portion laterally adjacent to a volume portion, wherein the volume portion comprises a photoisomerizable material, and/or wherein the device is configured to guide electromagnetic radiation to the volume portion, and wherein the transfer tool is configured to transfer the semiconductor chip.

19. A transfer tool comprising:

an adhesive stamp having an adhesive surface configured to pick up a semiconductor chip, wherein the adhesive stamp is deformable, wherein the adhesive surface is formed by a part of an outer surface of the adhesive stamp, wherein the surface area of the adhesive surface is adjustable by deformation of the adhesive stamp, and wherein the adhesive surface is free of interruptions, a device configured to adjust a surface area of the adhesive surface, wherein the transfer tool is configured to transfer the semiconductor chip, and wherein the adhesive stamp has an opening, the device being configured to adjust a volume of the opening, or wherein the adhesive stamp comprises a deformable volume portion, the adhesive surface is a part of an outer surface of the volume portion, the adhesive stamp has a deformation portion laterally adjacent to the volume portion, and wherein the device is configured to exert a force on the adhesive stamp in the deformation portion, which is directed transversely or perpendicularly to a main extension plane of the adhesive stamp, the force being a magnetic or an electrostatic force, or wherein a metal layer is located on the outer surface of the adhesive stamp.

* * * * *